United States Patent [19]

Hollingsworth

[11] 4,237,472

[45] Dec. 2, 1980

[54] HIGH PERFORMANCE ELECTRICALLY ALTERABLE READ ONLY MEMORY (EAROM)

[75] Inventor: Richard J. Hollingsworth, Princeton, N.J.

[73] Assignee: RCA Corporation, New York, N.Y.

[21] Appl. No.: 19,586

[22] Filed: Mar. 12, 1979

[51] Int. Cl.³ .................... H01L 27/02; H01L 29/72; H01L 29/34; H03K 5/00
[52] U.S. Cl. ........................................ 357/43; 357/35; 357/46; 357/54; 307/238; 365/177; 365/184
[58] Field of Search ...................... 357/23, 35, 43, 54, 357/46; 307/238; 365/177, 184

[56] References Cited

U.S. PATENT DOCUMENTS

| | | | |
|---|---|---|---|
| 3,622,812 | 11/1971 | Crawford | 357/23 |
| 3,877,058 | 4/1975 | Cricchi | 357/54 |

*Primary Examiner*—Gene M. Munson
*Attorney, Agent, or Firm*—Birgit E. Morris; Donald S. Cohen; Sanford J. Asman

[57] ABSTRACT

The invention is a memory device which includes a metal-nitride-oxide semiconductor (MNOS) insulated gate field effect transistor (IGFET) which is built in series with the emitter of a bipolar transistor to provide both bipolar collector-to-emitter breakdown voltage capability and bipolar radiation hardness while retaining MNOS memory performance.

9 Claims, 4 Drawing Figures

HIGH PERFORMANCE ELECTRICALLY ALTERABLE READ ONLY MEMORY (EAROM)

The present invention relates to semiconductor integrated circuit devices, and in particular, it relates to Read Only Memories (ROMs) which are used in many electronic systems, such as computer systems. In one type of ROM, namely the Electrically Alterable Read Only Memory (EAROM), the memory elements can be appropriately altered or "programmed". Thus, EAROMs are useful for producing ROMs which are used in specialized systems in which the volume of ROMs required do not justify a specialized ROM.

The present invention relates to an improved EAROM which is highly radiation tolerant, because it combines a thin oxide metal nitride oxide semiconductor (MNOS) transistor with a bipolar transistor and both types of transistors are highly radiation tolerant.

In the Drawing

Figure 1:
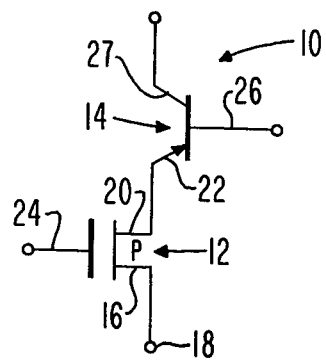
FIG. 1 is a schematic diagram of the memory cell of the present invention.

Referring now to FIG. 1, the memory cell 10 of the present invention comprises a metal nitride oxide semiconductor (MNOS) transistor 12 and a bipolar transistor 14. In the preferred embodiment of the present invention, the MNOS transistor 12 is a P-channel MNOS transistor whose source 16 is connected to a first terminal 18 and whose drain 20 is connected to the emitter 22 of the bipolar transistor 14. In the preferred embodiment of the invention, the bipolar transistor 14 is a PNP transistor. The gate 24 of the MNOS transistor 12, and the base 26 and collector 27 of the bipolar transistor 14 are connected to other memory cells 10 as will be explained hereinafter.

Figure 2:
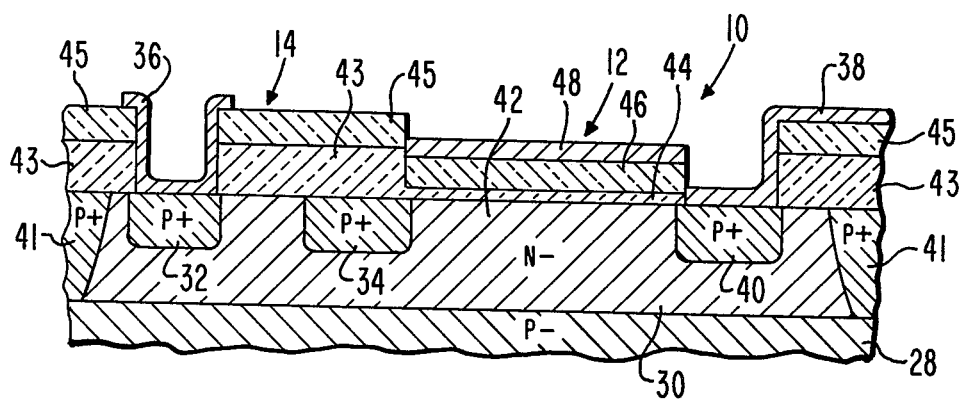
FIG. 2 is a cross-sectional view of one embodiment of the memory cell of the present invention.

Referring now to FIG. 2 the memory cell 10 is shown implemented in a monolithic circuit formed in a substrate 28 of semiconductor material. In the preferred embodiment of the invention, the substrate 28 is comprised of lightly doped P type silicon. An N− epitaxial layer 30 is formed on the substrate 28 and the layer 30 acts as the base of the bipolar transistor 14. P+ regions 32, 34 act as the collector and emitter, respectively, of the bipolar transistor 14. A metallic contact 36, provides ohmic contact to the collector 32 of the bipolar transistor 14. Contact to the N− layer 30, i.e. contact to the base of bipolar transistor 14 can be achieved by providing an N+ diffusion into the epitaxial layer 30 with appropriate ohmic contact thereto as will be seen with reference to FIG. 4. As will be understood by those skilled in the art, the present invention can be made using an N− type substrate or an N− type well in a P− type substrate instead of the N− epitaxial layer 30. In any event, the width of the base of the bipolar transistor 14 is the distance from the collector 32 to the emitter 34.

The MNOS transistor 12 is comprised of the P+ type emitter region 34 of the bipolar transistor 14 which simultaneously acts as the drain of the MNOS transistor 12. A P+ region 40 acts as the source of the MNOS transistor 12. Ohmic contact is made to the source region 40 via a metallic contact 38. The portion of the N− layer 30 between the drain 34 and source 40 acts as the channel region 42 of the MNOS transistor 12.

A thin silicon dioxide layer 44 having a thickness of between about 20 A and 60 A (20 A in the preferred embodiment of the invention) overlies the channel region 42. A silicon nitride layer 46, having a thickness of about 450 A overlies the silicon dioxide layer 44, and a metallic gate 48 overlies the silicon nitride layer 46. In the preferred embodiment of the invention, the metallic contacts 36, 38 and the metal gate 48 are comprised of aluminum. The MNOS transistor 12 of the preferred embodiment uses the thin oxide layer 44, because it has been shown that a thin oxide layer can sustain a total radiation dose level on the order of $10^8$ rads-Si and can be tolerant to extreme neutron fluence without adverse effects of the type encountered by MOS devices having thicker channel oxides.

Outside of the region occupied by the MNOS transistor 12 thick oxide layers 43 overlie the surface of the substrate 28, and silicon nitride layers 45 overlie the thick oxide layers 43. In the preferred embodiment of the invention, P+ isolation regions 41, which extend from the surface of the substrate 28 through the N-epitaxial layer 30, are used to separate memory cells as will be seen hereinafter.

While a thin oxide MNOS transistor appears to be an ideal memory element for use in a high radiation ambient, problems have heretofore arisen in integrating thin oxide MNOS transistors into an x-y matrix scheme for a large bit capacity memory. In order to obtain a compact and efficient read out source, drain and gate lines are typically used and shared by many memory transistors in a matrix. The programming of a thin oxide MNOS device typically requires a potential of about 30 volts to be applied to the source, drain, and gate lines in an appropriate fashion. In order to attain individual transistor programmability, the transistors sharing the source, drain, and/or gate lines with the transistor being programmed must not receive the high programming voltages which could inadvertently change their memory states. It is herefore necessary to ground some lines relative to the ±30 volt programming potential. As a result all of the MNOS transistors in a thin oxide MNOS memory matrix are required to sustain a 30 volt source-to-drain potential (when $V_{GS}=0$ volts) without conducting source-to-drain current.

The problem which has existed heretofore, is that thin oxide MNOS devices will not sustain a 30 volt source-to-drain voltage without breaking down and conducting current. Accordingly, heretofore a "stepped oxide" MNOS transistor also called a "drain source" protected MNOS transistor has generally been used in MNOS transistor memory arrays. Such "stepped oxide" MNOS transistors are not radiation tolerant, so they cannot be used in applications in which there is a high radiation ambient. Accordingly, the preferred embodiment of the present invention employs the lateral PNP transistor 14 to serve as a current switch because bipolar transistors are capable of sustaining high radiation levels and switching high currents.

While the proposed bipolar element is a lateral PNP transistor, the present inventive concept includes alternatives such as a vertical NPN element used in conjunction with an N channel MNOS transistor or other similar arrangements, such as placing the transistor in series with either or both of the source or drain ends of the MNOS transistor. Such alternatives to the basic memory cell would be obvious to those having skill in the art.

Figure 3:
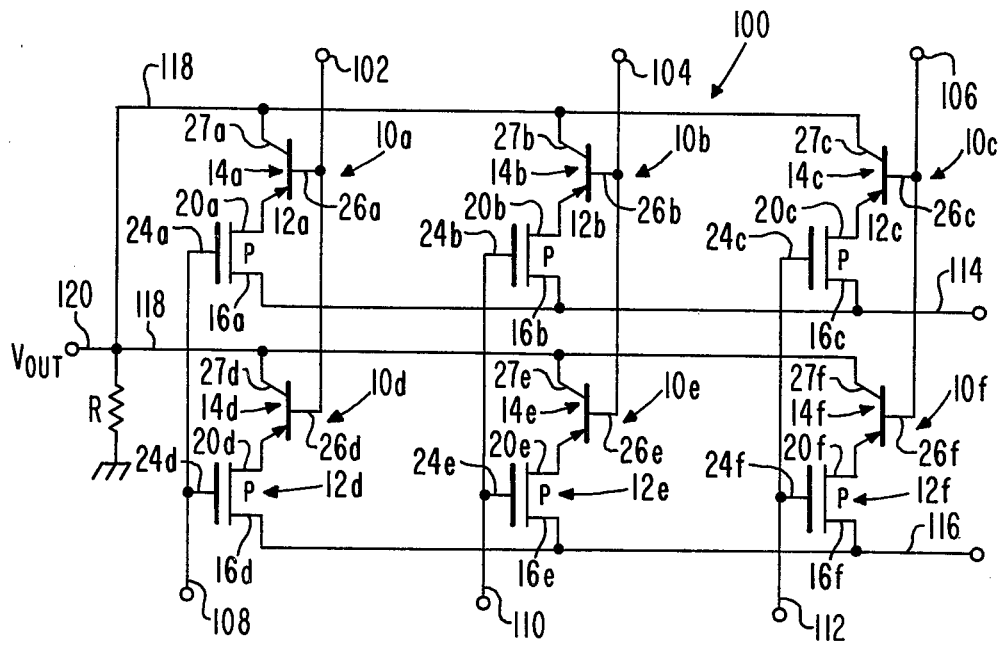
FIG. 3 is a schematic diagram showing one embodiment of a portion of an EAROM manufactured in accordance with the present invention.

Referring now to FIG. 3, a schematic diagram of a portion of a memory 100 built in accordance with the present invention is shown. The portion which is shown is a 3×2 array comprising memory cells 10a–10f, each of which is of the type described heretofore. The bases 26a–26f of the bipolar transistors 14a–14f of each of the memory cells in a given column are tied together and to base lines 102, 104, 106.

Similarly, the gates 24a–24f of each of the MNOS transistors 12a–12f of the memory cells 10a–10f in a given column are tied together and to the gate lines 108, 110, and 112. The sources 16a–16c of the MNOS transistors 12a–12c of the first row are tied together and to a source line 114, and the sources 16d–16f of the MNOS transistors 12d–12f of the second row are tied together and to a source line 116.

Finally, the collectors 27a–27f of all of the bipolar transistors 14a–14f are tied together via lines 118 to an output terminal 120. The output terminal 120 is connected to ground through an output resistor, R.

While there are many ways of programming the individual cells 10a–10f of the memory 100, the preferred method of programming is accomplished in two steps. First, there is a "Block-Erase" in which all of the cells 10a–10f are turned "ON". By "ON" it is meant that the P channel MNOS transistor 12a–12f of each cell 10a–10f has the most positive threshold $V_{TH}$, i.e. the least negative $V_{TH}$. In the preferred embodiment of the invention, the $V_{TH}$ of the MNOS transistors 12a–12f which are "ON" is approximately −0.5 volts.

In order to perform a "Block-Erase" the gate lines 108, 110 and 112 are all grounded and the base lines 102, 104, 106 and the source lines 114, 116 all have about −30 volts imposed upon them.

When the voltages set forth above are imposed upon the various lines, each of the MNOS transistors 12a–12f will have a net positive gate-to-substrate voltage. Thus, electrons will tunnel to the silicon dioxide-silicon nitride interface of the MNOS transistors 12a–12f thereby populating the electron traps at the interface. Similarly, the hole traps at the silicon dioxide-silicon nitride interface will be depopulated thereby providing a net negative charge at the interface which charge will attract holes to the channel region making each of the MNOS transistors 12a–12f easy to turn "ON".

After the "Block-Erase" has been performed, individual memory cells 12–10f are programmed "OFF" by appropriately imposing voltages on the lines associated with the cell to be turned "OFF". If it is desired to program cell 10c into an "OFF" condition, voltages are imposed on the various lines which have the effect of making the threshold voltage of MNOS transistor 12c much more negative than the threshold voltages of an MNOS transistor which has been programmed "ON".

In order to program the MNOS transistor 12c into an "OFF" state the gate line 112 which is connected to the selected cell 10c is brought to a voltage of −30 volts. The other gate lines 108 and 110 which are not connected to the selected cell 10c and all of the base lines 102, 104, and 106 are connected to ground. The source line 114 in the row of the selected cell 10c is brought to ground while the source line 116 which is in the row of non-selected cells 10d–10f is brought to −30 volts.

As a result of the placement of the voltages described above on the various lines, MNOS transistor 12c will be turned "ON" and will have a net negative gate-to-substrate potential of about −30 volts. The effect of that potential is to depopulate the electron traps in transistor 12c's silicon dioxide-silicon nitride interface and to populate hole traps in that transistor's silicon dioxide-silicon nitride interface thereby making the threshold voltage being more negative, i.e. to a value of about −12 volts.

The other MNOS transistors 12a and 12b in the row of the selected cell 10c will have ground potential both on their gates 24a and 24b and on their substrates (i.e. the bases 26a and 26b of the bipolar transistors 14a and 14b). Accordingly, those cells 10a and 10b will not be affected by the writing or programming operation conducted on cell 10, because there is no potential difference between the substrate and the gate.

The cell 10f which is in the same column as the selected cell 10c will also not be affected by the writing operation on cell 10c. The gate 24f and source 16f of MNOS transistor 12f will be at the same potential and its substrate will be held at ground. The source 16f acts as the drain of the transistor 12f, because it is at a more negative potential than the drain 20f (which acts as the transistor's source). Thus, the transistor 12f turns "ON". However, the induced channel will have a potential of about −30 volts. Accordingly, there will be essentially no gate-to-channel potential, and there will be no field present capable of inducing charge to tunnel to or from the silicon dioxide-silicon nitride interface.

Finally, the MNOS transistors 12d and 12e which are in neither the row nor the column of the selected cell 10c will not be affected by the programming of cell 10c. They will be turned "OFF" as a result of having 0 volts on both their substrates and their gates. Accordingly, there will be no field capable of causing charge tunneling, so the charge at the silicon dioxide-silicon nitride interface is not affected.

In order to address a particular cell, such as cell 10b, of the memory 100, a voltage of $+V_B$ is placed on the gates lines 108 and 112 which are not connected to the selected cell 10b and the same voltage is placed on the source line 114 of the row of memory cells including the selected cell 10b. A voltage of $-V_B$ is placed on the gate line 110 connected to the selected cell 10b and on the source line 116 which is not connected to the selected cell 10b. Similarly, a voltage of $+V_A$ is placed on the base lines 102, 106 in the columns containing non-selected cells, and a voltage of $-V_A$ is placed on the base line 104 in the column containing the selected cell 10b.

In the preferred embodiment of the invention, the voltage $V_A$ is approximately 1 volt and the voltage $V_B$ is approximately 5 volts. However, other voltages can be used as will be understood by those of ordinary skill in the art. Placing the voltages on the lines as described above biases both the bipolar transistor 14b and the MNOS transistor 12b into an "ON" condition (assuming that the MNOS transistor had been programmed "ON"), enabling current to pass through the cell 10b causing the voltage $V_{OUT}$ to go from 0 to approximately $+V_B$. Naturally, if MNOS transistor 12b had been programmed "OFF" no current would flow and $V_{OUT}$ would remain at 0 volts, i.e. ground potential.

Figure 4:
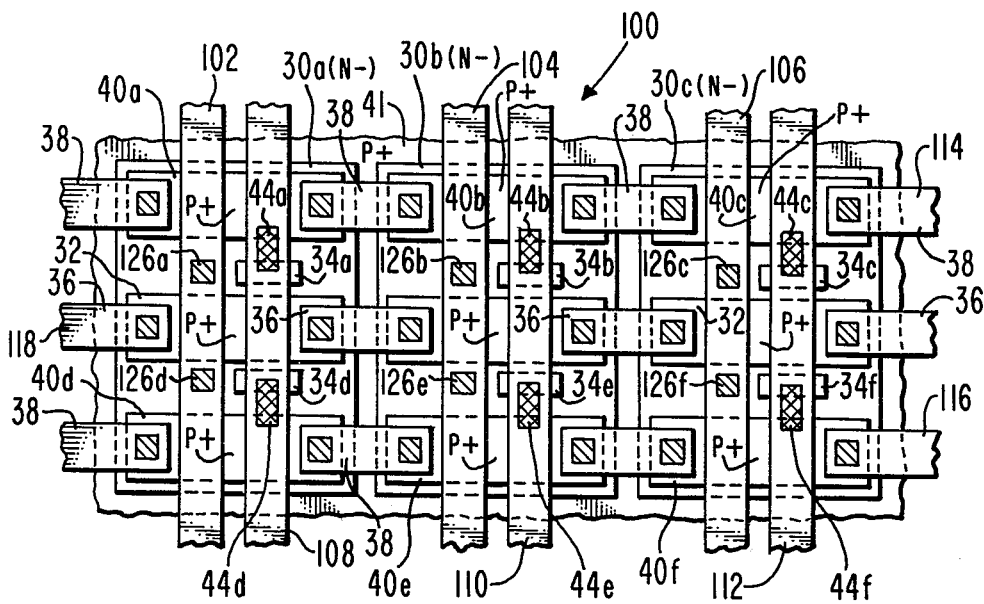
FIG. 4 is a modified plan view of the EAROM shown in FIG. 3.

Referring now to FIG. 4 a modified top plan view of a portion of the memory 100 is shown. In particular, the cells of a given column, as shown in FIG. 3, are formed together in areas 30a, 30b, 30c of N− type epitaxial silicon isolated by a P+ isolation region 41. The base lines 102, 104, 106 are metal lines running vertically in FIG. 4 connected to the bases of the bipolar transistors via contacts 126a–126f (shown with hatch marks) to underlying N+ regions (not shown). Similarly, the gate lines 108, 110, 112 are metal lines running vertically in FIG. 4 which overlie the thin oxide layers 44a–44f (shown cross-hatched) and form the gates of the MNOS transistors 12a–12f.

The output line 118 which connects the collectors of the bipolar transistors 14a–14f is comprised in part by metal portions 36 and in part by P+ wells 32. Similarly, the source lines 114 and 116 connecting the sources of the MNOS transistors 12a–12c and 12d–12f in the memory cells are comprised in part of metal lines 38 and in part by P+ diffusions 40a–40f.

Finally, the source line 116 connecting the sources of the MNOS transistors 12d–12f is comprised in part of metal lines 138 and in part by P+ diffusions 140.

In order to manufacture the EAROM 10 of the present invention one uses conventional photolithographic and semiconductor manufacturing techniques of the type well known in the semiconductor art. In particular, one starts with a P− type substrate 28 upon which an N− conductivity epitaxial layer 30 is grown. Diffusions are made for the P+ isolation regions 41, the P+ regions 32, 34 and 40. Then, N+ diffusions for the collector contacts (not shown) are made.

Following the diffusions described above, the surface of the substrate 28 is cleaned and an oxide layer is grown thereon. The portions of the oxide layer over the channel region of the MNOS transistor 12 are removed, and the thin channel oxide for the MNOS transistor 12 is regrown.

Next, a silicon nitride layer is deposited over the entire oxide layer, and the contact openings are defined in the silicon nitride layer. Then, the silicon nitride layer is used as an etch mask and the exposed silicon dioxide is removed from the contact regions. A metal layer, aluminum in the preferred embodiment of the invention, is deposited over the silicon nitride layer and then the metal layer is defined and etched. Finally, a thick protective oxide layer (not shown) is applied over the surface of the device and appropriate bond pad openings (not shown) are formed therein.

Many variations can be made to the preferred embodiment without departing from the present invention. In particular, the MNOS transistor 12 can be replaced by an N channel MNOS transistor and the bipolar transistor 14 can be replaced by an NPN transistor. Also, a "stepped oxide" MNOS transistor can be used in place of the "thin oxide" MNOS transistor, but some radiation tolerance would be lost in that event.

What is claimed is:

1. An integrated circuit memory comprising:
(A) a plurality of integrated circuit memory cells formed in a body of semiconductor material in an x-y array, each of which comprises:
   (i) a metal-nitride-oxide-semiconductor (MNOS) transistor comprising:
      (a) a semiconductor layer of a first conductivity type having a pair of spaced regions of opposite conductivity type formed therein, said spaced regions extending to a surface of said semiconductor layer;
      (b) a first insulating layer on the surface of said semiconductor layer, said first insulating layer extending at least between said pair of spaced regions;
      (c) a second insulating layer on the surface of said first insulating layer; and
      (d) a conductive gate on the surface of said second insulating layer; and
   (ii) a bipolar transistor comprising:
      (a) an emitter region of said opposite conductivity type, said emitter region comprising one of said spaced regions;
      (b) means for contacting said semiconductor layer, which semiconductor layer comprises the base of said bipolar transistor;
      (c) a collector region of said opposite conductivity type, said collector region extending into said semiconductor layer from a surface thereof, said collector region not lying between said pair of spaced regions and said collector region being separated from the one of said pair of spaced regions nearest to said collector region by a distance equal to the base width of said bipolar transistor; and
      (d) means for contacting said collector region; and
(B) means for addressing an individual one of said plurality of cells, said means for addressing comprising a first series of conductive metal lines extending over the surface of the substrate in one direction and a second series of conductive metal lines extending over the surface of said substrate in a direction orthogonal to said one direction, said second series of conductive metal lines not extending over or under said first series of conductive metal lines, said second series of conductive metal lines being connected to conductive diffused regions which extend under said first series of conductive metal lines.

2. The integrated circuit memory of claim 1 wherein said semiconductor layer is an N− type epitaxial layer formed on a substrate of a P type semiconductor material.

3. The integrated circuit memory of claim 1 wherein said semiconductor layer is an N− type well formed in a substrate of P type semiconductor material.

4. The integrated circuit memory of claim 3 wherein said first insulating layer is comprised of silicon dioxide.

5. The integrated circuit memory of claim 4 wherein said first insulating layer has a thickness of from 20 A to 60 A.

6. The integrated circuit memory of claim 5 wherein said second insulating layer is comprised of silicon nitride.

7. The integrated circuit memory of claim 6 wherein said second insulating layer has a thickness of about 450 A.

8. The integrated circuit memory of claim 7 wherein said means for contacting said emitter, said means for contacting said substrate and said conductive gate are all comprised of metal lines.

9. The integrated circuit memory of claim 8 wherein said metal is aluminum.

* * * * *